United States Patent [19]

Daniel

[11] 4,442,410
[45] Apr. 10, 1984

[54] TEMPERATURE STABILIZED AMPLIFIER FOR BOREHOLE USE

[75] Inventor: Joseph T. Daniel, Houston, Tex.

[73] Assignee: Halliburton Company, Duncan, Okla.

[21] Appl. No.: 316,208

[22] Filed: Oct. 29, 1981

[51] Int. Cl.³ .............................................. H03F 3/18
[52] U.S. Cl. .................................... 330/289; 330/264
[58] Field of Search ................ 330/264, 266, 289, 272

[56] References Cited

U.S. PATENT DOCUMENTS 4,302,727 11/1981 Iwamatsu ............................ 330/289

Primary Examiner—James B. Mollins
Assistant Examiner—Gene Wan
Attorney, Agent, or Firm—W. J. Beard

[57] ABSTRACT

A temperature stabilized amplifier is disclosed in the preferred and illustrated embodiment. This amplifier must perform in spite of extreme temperature fluctuations encountered in down hole tools. It must provide an output signal which is a large voltage swing input to a cable suspending the amplifier and other apparatus in a well bore. The apparatus utilizes complementary symmetry VMOS output transistors with a third VMOS transistor supported on a common heat sink with one of the two output transistors. The third transistor, in conjunction with an inverting amplifier, forms a bias which is applied to the output transistors in a manner such that temperature drift is cancelled. This, then, overcomes temperature drift. This extends the operating range of the equipment markedly.

2 Claims, 2 Drawing Figures

TEMPERATURE STABILIZED AMPLIFIER FOR BOREHOLE USE

BACKGROUND OF THE DISCLOSURE

This disclosure is directed to a high voltage, low impedance output amplifier to be used in a down hole logging tool. It is particularly intended for use in a logging tool which is normally operated on the end of a supportive electrical cable of perhaps 25,000 feet in length. The tool is normally lowered into a bore hole and is exposed to ever increasing temperatures as it traverses the bore hole. The depths, encountered with current drilling technology indicate that the device must operate at down hole temperatures of perhaps 275° C., a temperature routinely encountered in deep wells.

This amplifier is an output amplifier. It forms an output signal which is coupled to the cable. The output signal must be fairly large because the cable will often be 25,000 feet in length. The cable is always longer than the hole which is being tested inasmuch as a portion of the cable normally remains on the spool from which it is supplied. Signal degredation must be avoided in the transfer of this analog signal to the surface. A clean signal free of distortion must be obtained to enable data processing equipment to convert the signal after the signal has been received at the surface via transmission by the logging cable.

This disclosure sets forth an unobvious arrangement of VMOS transistors. VMOS transistors are desirable in certain regards. While a VMOS transistor has several advantages, one unavoidable detriment of the VMOS transistor is the fact that it has a temperature dependent bias drift. Normally, a VMOS transistor is voltage biased. The bias threshold is typically dependent to the extent of about 7 millivolts per degree centigrade temperature change. On encountering a 200° temperature change, bias threshold voltage will change about 1.400 volts. A fluctuation of this size completely obviates successful operation of the transistor.

It has been discovered that an output amplifier stage of VMOS transistors can be biased by the use of a third VMOS transistor to form a bias voltage. The bias voltage is inverted to obtain the proper polarity of the bias drift and is then applied to the output transistor stage. Bias tracking is assured by placing the third VMOS on a common heat sink with the output transistor controlling output current.

There are many methods of arranging output transistors in an amplifier configuration. It is desirable that the output transistor stage form fairly large voltage swings working into a low impedance cable. To achieve this kind of driver amplifier which is temperature stable over such a wide range is highly desirable.

BRIEF SUMMARY OF THE DISCLOSURE

This disclosure sets forth a complementary symmetrical output transistor stage comprising upper and lower VMOS transistors. A third VMOS is mounted on a common heat sink with the lower VMOS transistor. The three VMOS transistors are all provided with bias circuits for the respective gate terminals. The third VMOS transistor forms a temperature dependent output voltage when connected in a source follower arrangement. The output from the third VMOS transistor is a temperature dependent bias voltage which is then inverted and applied to the gate terminal of the lower VMOS transistor. The output VMOS transistors then amplify the variable signal applied to them independent of temperature over a very wide range dependent on scaling of the bias from the third VMOS transistor.

BRIEF DESCRIPTION OF THE DRAWINGS

So that the manner in which the above recited features, advantages and objects of the invention, as well as others, which will become apparent, are attained and can be understood in detail, a more particular description of the invention, briefly summarized above, may be had by reference to the embodiments thereof illustrated in the appended drawings, which drawings form a part of this specification. It is to be noted, however, that the appended drawings illustrate only typical embodiments of the invention and are not to be considered limiting of its scope, for the invention may admit to other equally effective embodiments.

DETAILED DESCRIPTION OF THE PREFERRED EMBODIMENT

Figure 1:
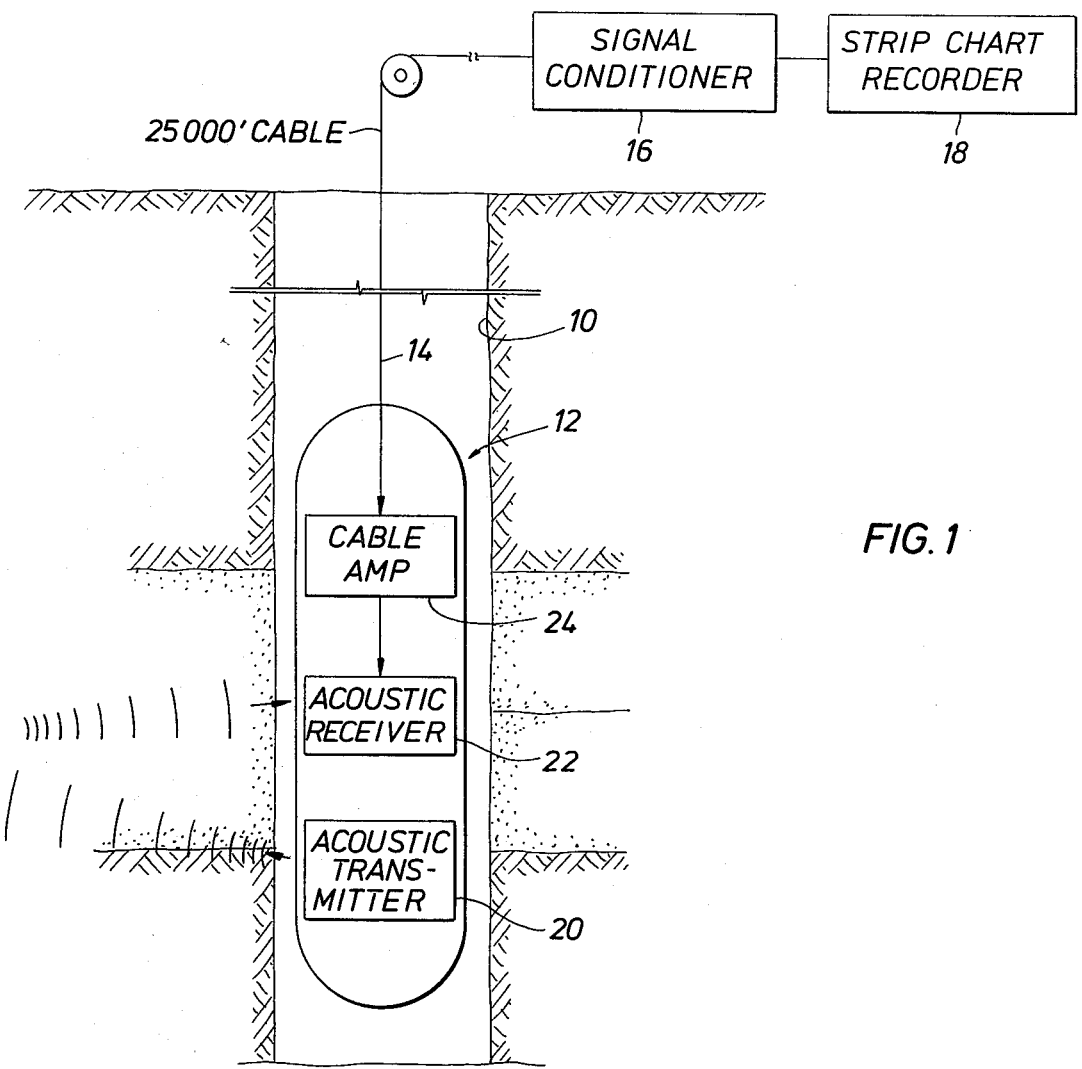
FIG. 1 discloses a down hole well logging tool incorporating the amplifier of the present disclosure and further illustrating a situation in which the amplifier of the present disclosure is exposed to a large temperature variation.

Attention is first directed to FIG. 1 of the drawings. There, a well bore 10, of substantial depth, is undergoing logging by a logging tool 12. The logging tool 12 includes a sonde suspended on a long cable 14. The cable can be very long, even as long as perhaps 25,000 feet. The cable extends to a spool, at the surface, where it is supplied from the spool to lower the logging tool 12 into the well bore 10. The cable includes an electrical conductor in an insulative sheath. The electrical conductor is connected to an output signal conditioner 16 which, in turn, connects to some kind of recorder, typically being a strip chart recorder 18. The recorder records the time dependent signals from the amplifier of this disclosure.

The logging tool includes a signal generating system. One example is an acoustic transmitter 20. It forms signals which are projected into the surrounding formations of the earth. The signals are returned to an acoustic receiver 22. The acoustic receiver 22 provides an input signal for a cable amplifier 24. The cable amplifier 24 includes all of the apparatus shown in FIG. 2 of the drawings.

Figure 2:
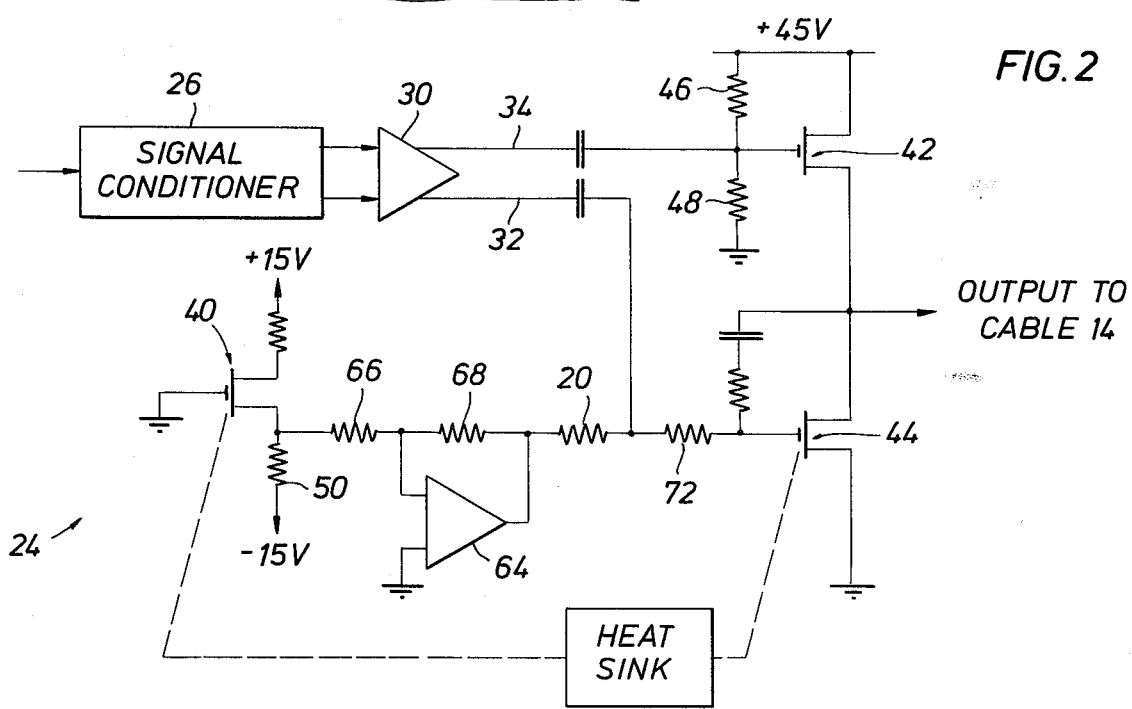
FIG. 2 is a schematic wiring diagram of the novel amplifier of this disclosure.

The cable amplifier 24 is shown better in FIG. 2. It includes an input signal conditioner 26. The signal conditioner 26 is input to a differential amplifier 30. A VMOS transistor 40 is described hereinafter as the third or biased transistor. Its function will be more readily apparent hereafter.

The analog signal to be amplified is supplied on the conductor 34 to the gate of an upper VMOS transistor 42. The numeral 44 identifies the lower VMOS transistor. The transistors 42 and 44 are connected together is a complementary symmetry arrangement. The output terminal for the cable 14 is between the transistors 42 and 44. The resistors 46 and 48 establish a bias voltage for the top VMOS transistor 42. The gate signal for the lower VMOS transistor 44 is provided through the conductor 32.

One important feature of this apparatus is the operation of the third VMOS transistor 40. A bias voltage for the gate of the transistor 40 is established by connecting a source resistor 50 to a negative supply voltage. A current will flow through the source resistor 50. This current has two components. The first component is the base line current which is established during routine operation of the device at a given temperature. There is a temperature dependent component to this current also flowing through the resistor 50. That is the current that flowing through resistor 50 creates the bias voltage of interest which is subsequently inverted for use in other portions of the circuitry.

An inverting amplifier 64 obtains an input via a resistor 66 connected to the source of the VMOS transistor 40. The variable bias, dependent on temperature, is input to the inverting amplifier 64. The gain of the amplifier is controlled by a feedback resistor 68. The signal is inverted, and the output is supplied through series resistors 20 and 72 to the lower VMOS transistor 44.

Operation of the Amplifier

Operation will be described referring first of all to the complementary symmetrically connected output transistors 42 and 44. An input signal fluctuation is applied to the respective gates of the output transistors assuming the omission of the bias circuit of this disclosure. The input signal would apply a voltage swing typical of the range permitted and the transistors 42 and 44 would then be driven to form an output signal fluctuation for the cable 14. The output would be driven by both transistors. The output signal would be determined by the joint operation of both transistors. This system would not operate well on exposure to large temperature fluctuations.

Now, consider operation with the enhancement of the bias circuit of the present invention. When an input signal fluctuation occurs, it is applied to the gate of the lower output VMOS transistor 44. Assuming stable temperature, the gate of the transistor 44 is still supplied with an amplifier signal reproducing the input signal. In other words, the transistor 44 is driven in the same manner as described above without the bias circuit. Going now to the circumstances in which there is an input signal variation as well as temperature drift, the temperature compensated amplifier of the present invention functions in following manner. Assume that the temperature increases. It will be observed that the transistors 40 and 44 are mounted on a common heat sink. Assume further that the temperature drift is quite sizable over a period of time, perhaps even as much as 200° C. Absent the temperature compensation circuit of this disclosure, this temperature variation will create about 1.4 volts drift in the threshold voltage. This drift would completely change the operating characteristics of the transistor amplifier. For instance, even if the output transistor 44 were biased well below threshold voltage, this drift would inevitably carry the transistor to an overdriven bias condition.

Without the bias compensation circuitry of the present invention, the transistor 44 would then be at an improperly biased operating condition and would not properly amplify the input signal. It probably would be driven into saturation and badly clip the input signal waveform.

Consider the temperature bias compensator of the present invention, which includes the third VMOS transistor and the inverting amplifier 64. The upper VMOS transistor 42 determines the output DC voltage while the lower output VMOS transistor 44 controls the current in the output transistor pair. Looking primarily to the current control by the transistor 44, that current is thus modified by the temperature dependent bias component. The net result is that changes in ambient temperature change the DC bias voltage and will even pull the gate voltage of the lower VMOS 44 to ground and even to a negative voltage to sustain the proper current through the lower transistor. On this point, the current through the transistor 44 is temperature dependent, but this dependency is overcome and offset by the bias voltage from the third transistor 40 which controls the bias current of the lower transistor 44.

The modified amplifier of the present invention is thus able to operate at extremely high temperatures and form an amplified audio range output signal working into a low impedance cable. Moreover, the output signal is amplified by a relatively constant amplification factor, and clipping or overdriving does not occur as a result of temperature drift. Distortion of any sort, as a result of temperature drift, is fairly well eliminated within a specified temperature range extended to extremely high levels. The third VMOS transistor 40 should be similar to the lower VMOS transistor. Differences in threshold can be accommodated by adjusting the bias level of the inverting amplifier 64.

While the foregoing is directed to the preferred embodiment, the scope thereof is determined by the claims which follow.

I claim:

1. An oil well logging tool amplifier for driving a well logging cable conductor having a low impedance and adapted to be exposed to temperature fluctuations encountered in a down hole environment, the amplifier circuit comprising:
   (a) an output conductor of a logging cable connected to a pair of output VMOS field effect transistors connected in a complementary symmetry arrangement wherein one of the transistors is designated as the lower transistor of the output pair of transistors;
   (b) a bias voltage forming third VMOS field effect transistor exposed on a common heat sink to the same temperature fluctuations to which said lower output transistor is exposed to, and further having substantially identical temperature drift characteristics therewith; and
   (c) bias voltage transfer circuit means connected from said third transistor and input to said output pair of transistors and including an inverting amplifier coupling an output of said third transistor to the gate of sid lower output transistor in such a manner as to apply a bias thereto which applied bias offsets the temperature dependent drift of said output pair of transistors, and wherein said offset bias maintains said output pair of transistors in a specified range of operative conditions during temperature fluctuations over a specified range.

2. The apparatus of claim 1 including a follower transistor resistor connected to said third transistor for developing a voltage thereacross which voltage is dependent on the temperature of said third transistor, and wherein the input of said inverting amplifier means is connected to said follower resistor for forming an amplified temperature dependent bias and the output of said inverting amplifier is connected to the gate of said lower output transistor.

* * * * *